US009806192B2

(12) United States Patent
Mason et al.

(10) Patent No.: US 9,806,192 B2
(45) Date of Patent: Oct. 31, 2017

(54) SUPPRESSION OF BACK-GATE TRANSISTORS IN RF CMOS SWITCHES BUILT ON AN SOI SUBSTRATE

(71) Applicant: RF Micro Devices, Inc., Greensboro, NC (US)

(72) Inventors: Philip W. Mason, Greensboro, NC (US); Michael Carroll, Jamestown, NC (US); Julio C. Costa, Oak Ridge, NC (US); Jan Edward Vandemeer, Kernersville, NC (US); Daniel Charles Kerr, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/133,669

(22) Filed: Apr. 20, 2016

(65) Prior Publication Data
US 2016/0380101 A1    Dec. 29, 2016

Related U.S. Application Data

(60) Provisional application No. 62/183,788, filed on Jun. 24, 2015.

(51) Int. Cl.
| H01L 29/78 | (2006.01) |
| H01L 27/092 | (2006.01) |
| H01L 27/12 | (2006.01) |
| H01L 23/66 | (2006.01) |

(52) U.S. Cl.
CPC .......... *H01L 29/7838* (2013.01); *H01L 23/66* (2013.01); *H01L 27/092* (2013.01); *H01L 27/1203* (2013.01)

(58) Field of Classification Search
CPC .............. H01L 29/7838; H01L 27/092; H01L 27/1203; H01L 23/66
See application file for complete search history.

(56) References Cited

U.S. PATENT DOCUMENTS

| 2002/0047169 A1* | 4/2002 | Kunikiyo .......... H01L 21/28202 257/410 |
| 2011/0171792 A1* | 7/2011 | Chang ................... G03F 9/7084 438/157 |

(Continued)

OTHER PUBLICATIONS

Brunet, L. et al., "New method to extract interface states density at the Back and the Front gate interfaces of FDSOI transistors from CV-GV measurements," 2009 IEEE International SOI Conference, Oct. 5-8, 2009, Foster City, CA, IEEE, 2 pages.

(Continued)

*Primary Examiner* — Long Pham
(74) *Attorney, Agent, or Firm* — Withrow & Terranova, P.L.L.C.

(57) ABSTRACT

The present disclosure relates to a silicon-on-insulator (SOI) substrate structure with a buried dielectric layer for radio frequency (RF) complementary metal-oxide semiconductor (CMOS) switch fabrications. The buried dielectric layer suppresses back-gate transistors in the RF CMOS switches fabricated on the SOI substrate structure. The SOI substrate structure includes a silicon handle layer, a silicon oxide layer over the silicon handle layer, a buried dielectric layer over the silicon oxide layer, and a silicon epitaxy layer directly over the buried dielectric layer.

20 Claims, 7 Drawing Sheets

(SECTION A of FIG. 6)

(56) References Cited

U.S. PATENT DOCUMENTS

2016/0329462 A1* 11/2016 Hu .......................... H01L 33/12
2017/0033204 A1*  2/2017 Yamazaki ......... H01L 29/66969

OTHER PUBLICATIONS

Lim, Hyung-Kyu et al., "Threshold Voltage of Thin-Film Silicon-on Insulator (SOI) MOSFET's," IEEE Transactions on Electron Devices, vol. ED-30, No. 10, Oct. 1983, pp. 1244-1251.

Lu, Qiang et al., "Two Silicon Nitride Technologies for Post-$SiO_2$ MOSFET Gate Dielectric," IEEE Electron Device Letters, vol. 22, No. 7, Jul. 2001, pp. 324-326.

Mazuré, C. et al., "Advanced SOI Substrate Manufacturing," 2004 IEEE International Conference on Integrated Circuit Design and Technology, ICICDT '04, 2004, pp. 105-111.

Ushiki, Takeo et al., "Evidence of Energetically-Localized Trap-States at SOI-BOX Interface in High-Dose SIMOX Wafers," Proceedings of the 1999 IEEE International SOI Conference, Oct. 1999, pp. 48-49.

* cited by examiner

*FIG. 3*
(RELATED ART, SECTION A of FIG. 2)

*FIG. 7*
(SECTION A of FIG. 6)

SUPPRESSION OF BACK-GATE TRANSISTORS IN RF CMOS SWITCHES BUILT ON AN SOI SUBSTRATE

RELATED APPLICATIONS

This application claims the benefit of U.S. provisional patent application No. 62/183,788, filed Jun. 24, 2015, the disclosure of which is incorporated herein by reference in its entirety.

FIELD OF THE DISCLOSURE

The present disclosure relates to a silicon-on-insulator (SOI) substrate structure for radio frequency (RF) complementary metal-oxide semiconductor (CMOS) switch fabrications, and more particularly to an SOI substrate structure with a buried dielectric layer for suppression of back-gate transistors in RF CMOS switches built on the SOI substrate.

BACKGROUND

Radio frequency (RF) switches are one of the highest volume RF devices used in wireless systems. In recent years, complementary metal-oxide semiconductor (CMOS) on silicon-on-insulator (SOI) substrate has become a major technology in the manufacturing of the RF switches. Fabrications of the RF CMOS switches on the SOI substrates may benefit from low cost, a large scale capacity of wafer production, and well-established CMOS libraries and design tools.

Figure 1:
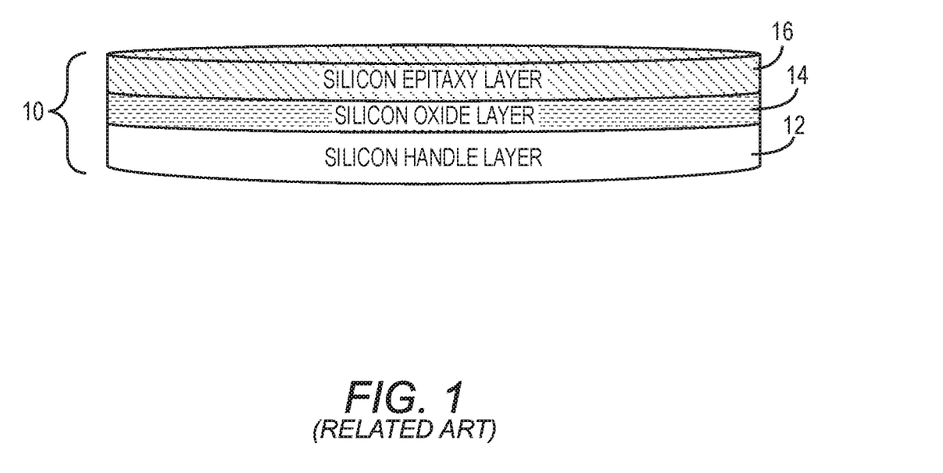
FIG. 1 shows a conventional SOI substrate.

The RF CMOS switches fabricated on conventional SOI substrates, however, bear deleterious back-gate transistors, which affect isolation performance of the RF CMOS switches. The conventional SOI substrate 10 shown in FIG. 1 includes a silicon handle layer 12, a silicon oxide layer 14 over the silicon handle layer 12, and a silicon epitaxy layer 16 over the silicon oxide layer 14.

Figure 2:
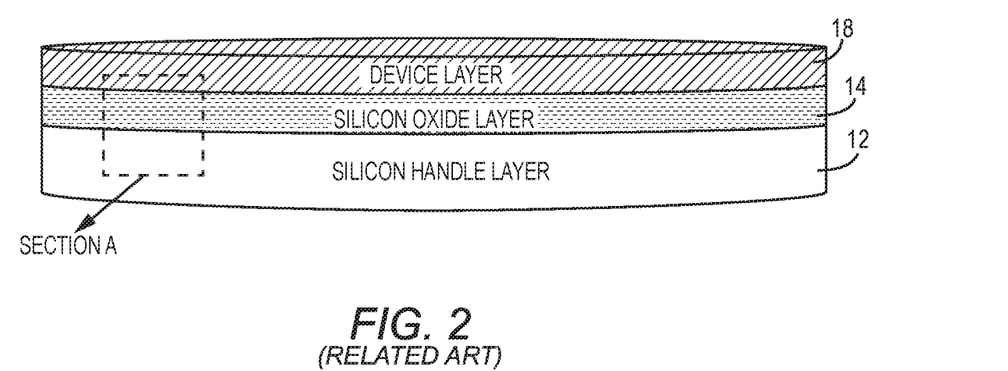
FIG. 2 shows a device layer fabricated on a conventional SOI substrate.

After the conventional SOI substrate 10 is formed, electronic components including RF CMOS switches may be integrated in or on the silicon epitaxy layer 16 to form a device layer 18 as depicted in FIG. 2. The device layer 18 may have a different thickness from the silicon epitaxy layer 16.

Figure 3:
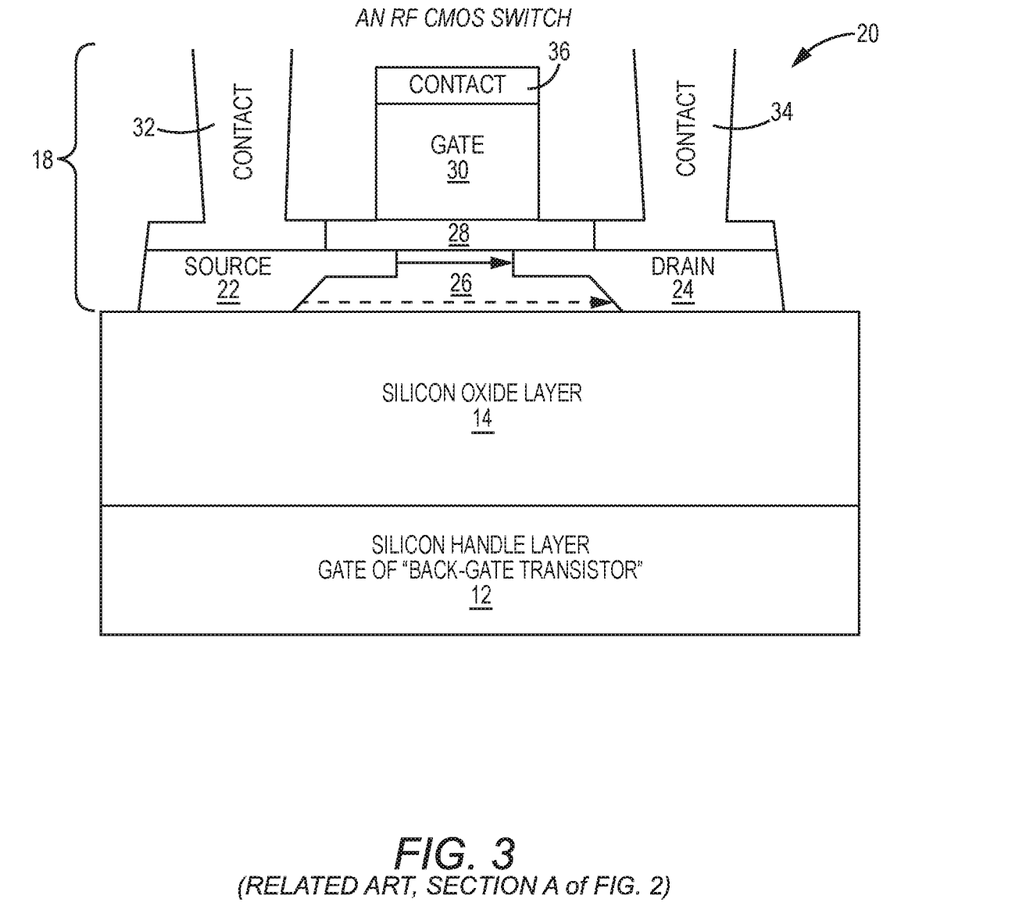
FIG. 3 shows an exemplary RF CMOS switch residing in the device layer shown in FIG. 2.

FIG. 3 shows an exemplary RF CMOS switch 20 residing in the device layer 18 within section A of FIG. 2. The exemplary RF CMOS switch 20 includes a source 22, a drain 24, a body 26, a gate dielectric region 28, a gate 30, a source contact 32, a drain contact 34, and a gate contact 36. In detail, the source 22, the drain 24, and the body 26 are formed over the silicon oxide layer 14. The gate dielectric region 28 is formed over the body 26, and the gate 30 is formed over the gate dielectric region 28. For simplification, other necessary regions of the RF CMOS switch 20 such as Field Oxide, Gate Spacers, and Metal layers are not depicted.

Herein, the source 22, the drain 24, the body 26, the gate dielectric region 28, and the gate 30 are used to achieve an intentional front-gate switch function of the exemplary RF CMOS switch 20. An upper solid arrow from the source 22 to the drain 24 shows a first conducting channel which operates when the intentional front-gate switch function of the exemplary RF CMOS switch 20 is enabled. Meanwhile, the source 22, the drain 24, the body 26, the silicon oxide layer 14, and the silicon handle layer 12 form an undesired back-gate transistor, where the silicon oxide layer 14 is used as a gate dielectric region in the back-gate transistor and the silicon handle layer 12 is used as a gate in the back-gate transistor. The front-gate switch and the back-gate transistor share the common source 22, the common drain 24, and the common body 26. A lower dashed arrow from the source 22 to the drain 24 shows a second conducting channel when the back-gate transistor operates in a closed mode.

Figure 4:
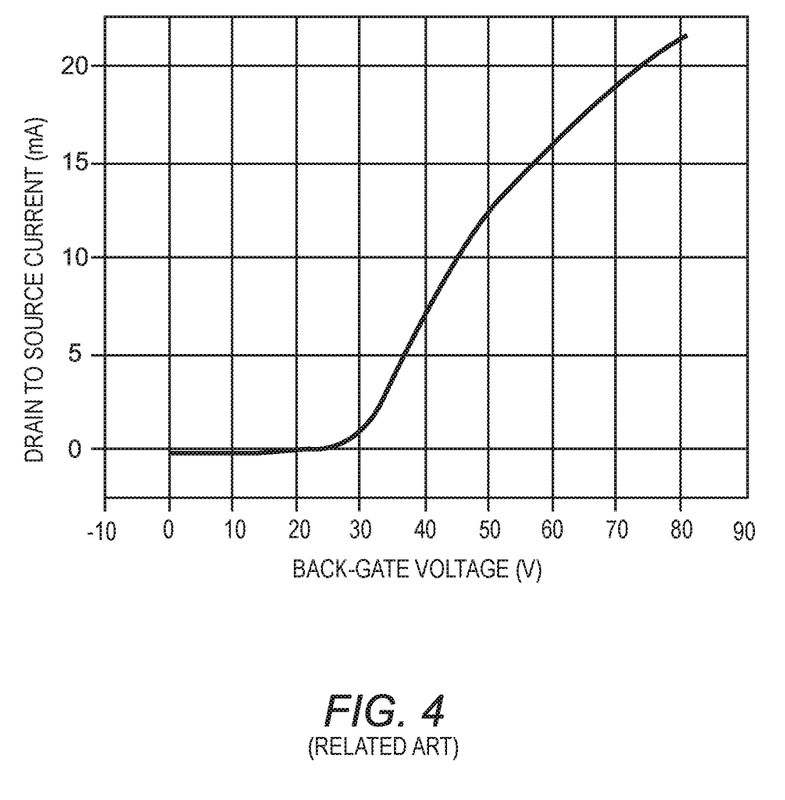
FIG. 4 shows a drain-to-source current of a back-gate transistor in an RF CMOS switch that is fabricated on a conventional SOI substrate.

FIG. 4 shows a drain-to-source current of the back-gate transistor in the RF CMOS switch 20 that is fabricated on the conventional SOI substrate 10 using typical commercial RF SOI technologies. The drain-to-source current is measured as a function of a back-gate voltage (a voltage applied to the silicon handle layer 12) when a front-gate voltage (a voltage applied to the gate 30) is off. For this RF SOI technology, the back-gate transistor turns on at about 28 volts and the drain-to-source current of the back-gate transistor increases significantly. Consequently, the source 22 is connected by a low impedance channel to the drain 24, even if the intentional front-gate switch function of the exemplary RF CMOS switch 20 is disabled. The second conducting channel for the back-gate transistor (the lower dashed arrow) dramatically reduces the RF isolation of the exemplary RF CMOS switch 20 and the exemplary RF CMOS switch 20 will not work optimally.

Accordingly, there remains a need for improved SOI substrate designs to suppress the back-gate transistors in RF CMOS switches and achieve superior RF isolation performance of the RF CMOS switches.

SUMMARY

The present disclosure relates to a silicon-on-insulator (SOI) substrate structure with a buried dielectric layer for radio frequency (RF) complementary metal-oxide semiconductor (CMOS) switch fabrications. The buried dielectric layer suppresses back-gate transistors in the RF CMOS switches fabricated on the SOI substrate structure. The SOI substrate structure includes a silicon handle layer, a silicon oxide layer over the silicon handle layer, a buried dielectric layer over the silicon oxide layer, where the buried dielectric layer is not formed from silicon oxide, and a silicon epitaxy layer over the buried dielectric layer. A top surface of the buried dielectric layer is in contact with a bottom surface of the silicon epitaxy layer. The silicon epitaxy layer is used to form RF CMOS switches. Each of the RF CMOS switches includes a body directly over the top surface of the buried dielectric layer, a source over the top surface of the buried dielectric layer and in contact with a first side surface of the body, and a drain over the top surface of the buried dielectric layer and in contact with a second side surface of the body. The body separates the source and the drain.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

It will be understood that for clear illustrations, FIG. 1-FIG. 7 may not be drawn to scale.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 5:
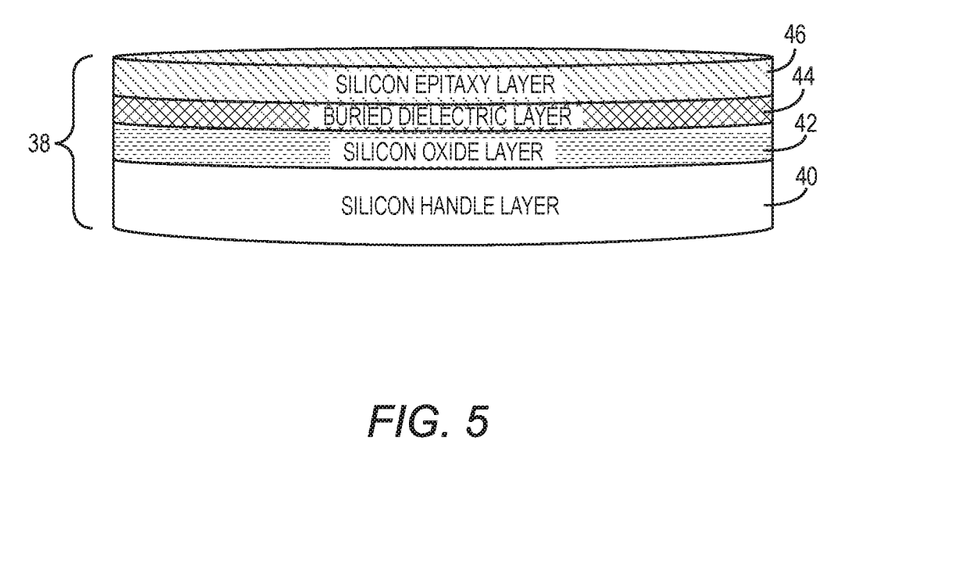
FIG. 5 shows an exemplary SOI substrate structure with a buried dielectric layer according to one embodiment of the present disclosure.

FIG. 5 provides an SOI substrate structure 38 according to one embodiment of the present disclosure. In this embodiment, the SOI substrate structure 38 includes a silicon handle layer 40, a silicon oxide layer 42 over the silicon handle layer 40, a buried dielectric layer 44 over the silicon oxide layer 42, and a silicon epitaxy layer 46 over the buried dielectric layer 44. A top surface of the buried dielectric layer 44 is in contact with a bottom surface of the silicon epitaxy layer 46.

In detail, the silicon handle layer 40 is formed by a low cost silicon material, which has no requirement for high resistivity or low harmonic generation. A thickness of the silicon handle layer 40 is thicker than 100 μm, where 300 μm-700 μm is a typical range. A thickness of the silicon oxide layer 42 is generally between 200 Angstrom (Å) and 1 μm.

The buried dielectric layer 44 is not formed from silicon oxide. Herein, the buried dielectric layer 44 is engineered so as to effectively restrict the modulation of a surface potential to no more than +/−0.2 eV from its equilibrium state at the interface between the buried dielectric layer 44 and the silicon epitaxy layer 46. The surface potential is deemed 'pinned' when restricted to +/−0.2 eV from its equilibrium state. Therefore, regardless of any voltages which may be present in the silicon handle layer 40 or the silicon oxide layer 42, there is essentially no current that exists at the interface between the silicon epitaxy layer 46 and the buried dielectric layer 44. Consequently, the buried dielectric layer 44 will suppress back-gate transistors in RF CMOS switches, which are fabricated on/in the silicon epitaxy layer 46 in a later process. The buried dielectric layer 44 has excellent adhesion to the silicon oxide layer 42 and the silicon epitaxy layer 46.

In the present disclosure, one possible material that may be used to form the buried dielectric layer 44 is silicon nitride due to its relatively low deposition costs and the high quality of deposition systems available in the industry. Silicon nitride has a thermal conductivity around 30 W/mK, which is neither too low so as to require an extremely thin layer nor too high to allow for a very thick layer. In general, the buried dielectric layer 44 formed of silicon nitride has a thickness between 400 Å and 2000 Å, although thinner or thicker values may be engineered depending on different application requirements.

Other materials, such as aluminum nitride, aluminum oxide, and hafnium oxide may also be used to form the buried dielectric layer 44 and provide the necessary surface potential pinning to suppress the undesired back-gate transistors in RF CMOS switches, which are fabricated on/in the silicon epitaxy layer 46 in a later process. When the buried dielectric layer 44 is formed by dielectric materials with degraded thermal conductivity such as hafnium oxide (TC<2 W/mK), a thickness of the buried dielectric layer 44 is optimized to be as thin as necessary to disable or suppress the effects of the back-gate transistors while not significantly increasing the thermal resistance of the RF CMOS switches, generally between 100 Å and 1000 Å. When the buried dielectric layer 44 is formed by superior thermal conductivity material such as aluminum nitride (TC>280 W/mK) or aluminum oxide (TC>30 W/mK), the buried dielectric layer 44 may be significantly thicker, generally between 500 Å and 3000 Å.

The silicon epitaxy layer 46 is formed from a device grade silicon material, which has desired silicon epitaxy characteristics to form electronic components. The silicon epitaxy layer 46 has a higher resistivity and lower harmonic generation than the silicon handle layer 40. In general, the resistivity of the silicon epitaxy layer 44 is between 1 ohm-cm and 50 ohm-cm depending on different fabrication processes. A thickness of the silicon epitaxy layer 46 is between 100 Å and 2 µm. Those skilled in the art will recognize that the present disclosure may be practiced in a number of different substrate diameters. Typical implementations in today's industry would yield final substrate structure in a 200 mm or 300 mm diameter.

For most modern RF CMOS SOI technologies, an embedded polysilicon layer in the substrate might be used for suppression of substrate-induced harmonics, typically called a 'trap rich layer'. The disclosed SOI substrate structure 38 may also include an embedded polysilicon layer (not shown) between the silicon handle layer 40 and the silicon oxide layer 42 for suppression of harmonics from the silicon handle layer 40. Those skilled in the art will recognize that this embedded polysilicon layer between the silicon handle layer 40 and the silicon oxide layer 42 will not essentially affect the surface potential pinning at the interface between the buried dielectric layer 44 and the silicon epitaxy layer 46.

Figure 6:
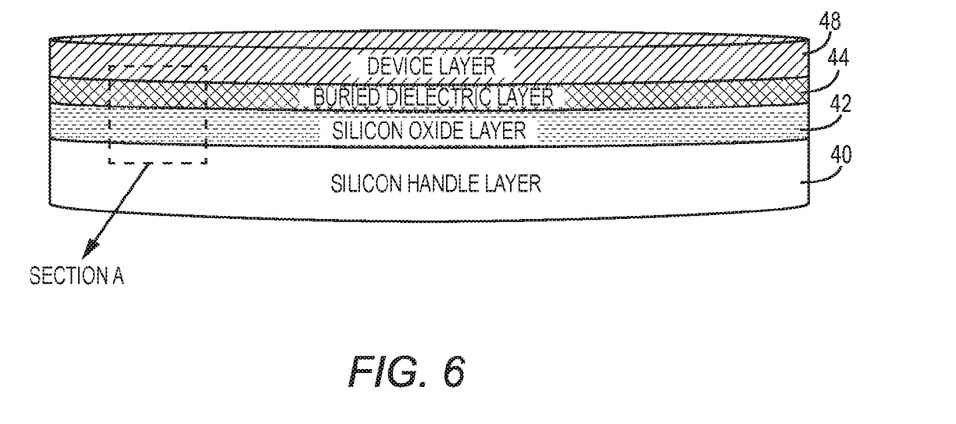
FIG. 6 shows a device layer fabricated on the SOI substrate structure shown in FIG. 5.

After the SOI substrate structure 38 is formed, electronic components including RF CMOS switches may be integrated in or on the silicon epitaxy layer 46 to form a device layer 48 as depicted in FIG. 6. The thickness of the silicon epitaxy layer 46 and a thickness of the device layer 48 may be different. The thickness of the device layer 48 is between 200 Å and 2 µm.

Figure 7:
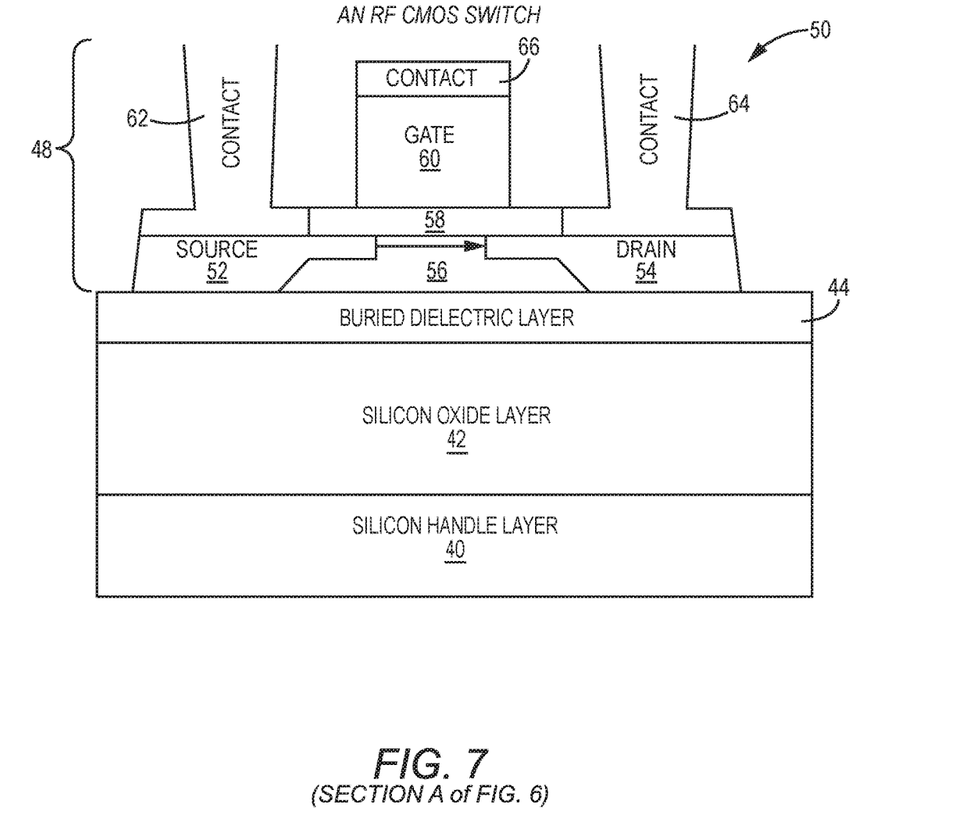
FIG. 7 shows an exemplary RF CMOS switch residing in the device layer shown in FIG. 6.

FIG. 7 shows an exemplary RF CMOS switch 50 residing in the device layer 48 within section A of FIG. 6. The switching speed of the RF CMOS switch 50 is not limited in the present disclosure. CMOS switches without radio frequency may also be applicable. The exemplary RF CMOS switch 50 includes a source 52, a drain 54, a body 56, a gate dielectric region 58, a gate 60, a source contact 62, a drain contact 64, and a gate contact 66. For simplification, other necessary regions of the RF CMOS switch 50 such as Field Oxide, Gate Spacers, and Metal layers are not depicted.

In detail, the body 56 is formed directly over the top surface of the buried dielectric layer 44. The source 52 is formed over the top surface of the buried dielectric layer 44 and in contact with a first side surface of the body 56. The drain 54 is formed over the top surface of the buried dielectric layer 44 and in contact with a second side surface of the body 56. The body 56 separates the source 52 and the drain 54. The gate dielectric region 58 over the body 56 is formed of silicon oxide. The gate 60 is formed over the gate dielectric region 58 and the gate dielectric region 58 separates the body 56 and the gate 60. In addition, the source contact 62, the drain contact 64, and the gate contact 66 are directly over the source 52, the drain 54, and the gate 60, respectively.

The source 52, the drain 54, the body 56, the gate dielectric region 58, and the gate 60 are used to achieve an intentional front-gate switch function of the exemplary RF CMOS switch 50. A solid arrow at a top portion of the body 56 from the source 52 to the drain 54 shows a conducting channel which operates when the intentional front-gate switch function of the exemplary RF CMOS switch 50 is enabled.

Meanwhile, the buried dielectric layer 44 is engineered so as to effectively restrict the modulation of a surface potential to no more than +/−0.2 eV from its equilibrium state at the interface between the buried dielectric layer 44 and the body 56. Therefore, regardless of any voltages which may be present in the silicon handle layer 40 or the silicon oxide layer 42, a conducting channel will not be formed at the bottom portion of the body 56 between the source 52 and the drain 54. Those skilled in the art will recognize that the introduction of the buried dielectric layer 44 between the body 56 and the silicon oxide layer 42 suppresses the back-gate transistor in the RF CMOS switch 50 by surface potential pinning at the interface between the body 56 and the buried dielectric layer 44.

In order to effectively pin the surface potential at the interface between the body 56 and the buried dielectric layer 44, it is desirable to have a high density of states ($>10^{11}/cm^2$) at the interface between the buried dielectric layer 44 and the body 56. However, the interface with a high density of states may cause a high carrier recombination velocity, thereby increasing an undesirable surface leakage current. For high speed RF switches, the surface leakage current is not allowable in the SOI substrate structure 38. Therefore, the materials used to form the buried dielectric layer 44 are deposited under conditions which cause the interface state density to be high enough to pin the surface potential, but not too high so as to cause a surface leakage current. For some digital RF devices, which may tolerate some surface leakage current, the SOI substrate structure 38 may include a second silicon oxide layer (not shown) between the buried dielectric layer 44 and the device layer 48. The second silicon oxide layer may have a thickness between 20 Å and 100 Å.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
    a silicon handle layer;
    a silicon oxide layer over the silicon handle layer;
    a buried dielectric layer over the silicon oxide layer, wherein the buried dielectric layer is not formed from silicon oxide; and
    a silicon epitaxy layer over the buried dielectric layer, wherein a top surface of the buried dielectric layer is in contact with a bottom surface of the silicon epitaxy layer, and wherein the buried dielectric layer pins a surface potential at an interface between the buried dielectric layer and the silicon epitaxy layer.

2. The apparatus of claim 1 wherein the buried dielectric layer is formed of silicon nitride.

3. The apparatus of claim 2 wherein a thickness of the buried dielectric layer is between 400 Å and 2000 Å.

4. The apparatus of claim 1 wherein the buried dielectric layer is formed of aluminum nitride or aluminum oxide.

5. The apparatus of claim 4 wherein a thickness of the buried dielectric layer is between 500 Å and 3000 Å.

6. The apparatus of claim 1 wherein the buried dielectric layer is formed of hafnium oxide.

7. The apparatus of claim 6 wherein a thickness of the buried dielectric layer is between 100 Å and 1000 Å.

8. The apparatus of claim 1 wherein a thickness of the silicon oxide layer is between 200 Å and 1 μm.

9. The apparatus of claim 1 wherein a thickness of the silicon handle layer is thicker than 100 μm.

10. The apparatus of claim 1 wherein a thickness of the silicon epitaxy layer is between 100 Å and 2 μm.

11. An apparatus comprising:
   a silicon handle layer;
   a silicon oxide layer over the silicon handle layer;
   a buried dielectric layer over the silicon oxide layer, wherein the buried dielectric layer is not formed from silicon oxide; and
   a device layer directly over the buried dielectric layer, wherein the device layer includes a plurality of complementary metal-oxide semiconductor (CMOS) switches, and wherein the buried dielectric layer pins a surface potential at an interface between the buried dielectric layer and the device layer.

12. The apparatus of claim 11 wherein each of the plurality of CMOS switches comprises:
   a body directly over a top surface of the buried dielectric layer, wherein the buried dielectric layer pins the surface potential at an interface between the buried dielectric layer and the body;
   a source over the top surface of the buried dielectric layer and in contact with a first side surface of the body; and
   a drain over the top surface of the buried dielectric layer and in contact with a second side surface of the body, wherein the body separates the source and the drain.

13. The apparatus of claim 12 wherein each of the plurality of CMOS switches further comprises:
   a gate dielectric region over the body;
   a gate over the gate dielectric region, wherein the gate dielectric region separates the gate and the body; and
   a source contact directly over the source, a drain contact directly over the drain, and a gate contact directly over the gate.

14. The apparatus of claim 11 wherein the buried dielectric layer is formed from silicon nitride.

15. The apparatus of claim 14 wherein a thickness of the buried dielectric layer is between 400 Å and 2000 Å.

16. The apparatus of claim 11 wherein a thickness of the silicon oxide layer is between 200 Å and 1 μm.

17. The apparatus of claim 11 wherein a thickness of the silicon handle layer is thicker than 100 μm.

18. The apparatus of claim 11 wherein a thickness of the device layer is between 200 Å and 2 μm.

19. The apparatus of claim 11 wherein the buried dielectric layer is formed of one of a group consisting of aluminum nitride, aluminum oxide, and hafnium oxide.

20. An apparatus comprising:
   a silicon handle layer;
   a first silicon oxide layer over the silicon handle layer;
   a buried dielectric layer over the first silicon oxide layer, wherein the buried dielectric layer is not formed from silicon oxide;
   a second silicon oxide layer over the buried dielectric layer, wherein the second silicon oxide layer has a thickness between 20 Å and 100 Å, and wherein a top surface of the buried dielectric layer is in contact with a bottom surface of the second silicon oxide layer; and
   a device layer over the second silicon oxide layer.

* * * * *